US011587226B2

(12) United States Patent
Araki et al.

(10) Patent No.: US 11,587,226 B2
(45) Date of Patent: Feb. 21, 2023

(54) MAGNETIC DOMAIN IMAGE PROCESSING APPARATUS AND MAGNETIC DOMAIN IMAGE PROCESSING METHOD

(71) Applicant: Hitachi, Ltd, Tokyo (JP)

(72) Inventors: Ryoko Araki, Tokyo (JP); Teruo Kohashi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 17/682,441

(22) Filed: Feb. 28, 2022

(65) Prior Publication Data

US 2022/0309636 A1 Sep. 29, 2022

(30) Foreign Application Priority Data

Mar. 26, 2021 (JP) .............................. JP2021-053004

(51) Int. Cl.
*G06T 7/00* (2017.01)
*G06T 7/20* (2017.01)

(52) U.S. Cl.
CPC ................ *G06T 7/001* (2013.01); *G06T 7/20* (2013.01); *G06T 2207/30136* (2013.01)

(58) Field of Classification Search
None
See application file for complete search history.

(56) References Cited

U.S. PATENT DOCUMENTS 11,163,974 B2 * 11/2021 Araki .................... G06V 20/698
2014/0197312 A1 * 7/2014 Harada .................. H01J 37/26
250/311

(Continued)

FOREIGN PATENT DOCUMENTS

JP 5699883 B2 4/2015

OTHER PUBLICATIONS

Fasheng Qiu et al, Characterization of applied tensile stress using domain wall dynamic behavior of grain-oriented electrical steel, Feb. 3, 2017,Journal of Magnetism and Magnetic Materials 432 (2017) 250-259 (Year: 2017).*

*Primary Examiner* — Tom Y Lu
*Assistant Examiner* — Rumana Khandekar
(74) *Attorney, Agent, or Firm* — Crowell & Moring LLP

(57) ABSTRACT

To provide a magnetic domain image processing apparatus and a magnetic domain image processing method by which strain of an electromagnetic steel sheet can be evaluated in more detail. The invention is a magnetic domain image processing apparatus that processes a magnetic domain image, and the magnetic domain image processing apparatus includes: an image acquisition unit configured to acquire a reference magnetic domain image and a positive magnetic domain image or acquire the reference magnetic domain image and a negative magnetic domain image, the reference magnetic domain image being a magnetic domain image that is obtained when a stimulus of a reference intensity that is an intensity serving as a reference is applied to a sample, the positive magnetic domain image being a magnetic domain image that is obtained when the stimulus of an intensity higher than the reference intensity is applied to the sample, and the negative magnetic domain image being a magnetic domain image that is obtained when the stimulus of an intensity lower than the reference intensity is applied to the sample; and an image generation unit configured to generate, based on the reference magnetic domain image and the positive magnetic domain image, or based on the reference magnetic domain image and the negative magnetic domain image, a stress distribution image indicating a distribution of a stress region that is a region where stress is generated.

8 Claims, 9 Drawing Sheets

(56) References Cited

U.S. PATENT DOCUMENTS

2015/0371374 A1* 12/2015 Zeng .................. G01N 21/3504
                                                                 382/274
2016/0223413 A1*  8/2016 Kubota .................. G01L 1/122
2017/0064319 A1*  3/2017 Fram .................... H04N 19/136

* cited by examiner

POSITIVE MAGNETIC DOMAIN IMAGE Ipos − REFERENCE MAGNETIC DOMAIN IMAGE Iref = FIRST DIFFERENCE IMAGE Ipos-Iref

REGION WHERE MAGNETIZATION IS REVERSED

REFERENCE MAGNETIC
DOMAIN IMAGE Iref

FIRST DIFFERENCE
IMAGE Ipos-Iref

MAGNETIC FIELD DIRECTION: POSITIVE

SECOND DIFFERENCE
IMAGE Ineg-Iref

MAGNETIC FIELD DIRECTION: NEGATIVE

SHAPE IMAGE SEM +
STRESS REGION

SHADED PORTION: REGION
WHERE MAGNETIZATION IS
NOT REVERSED (STRESS REGION)

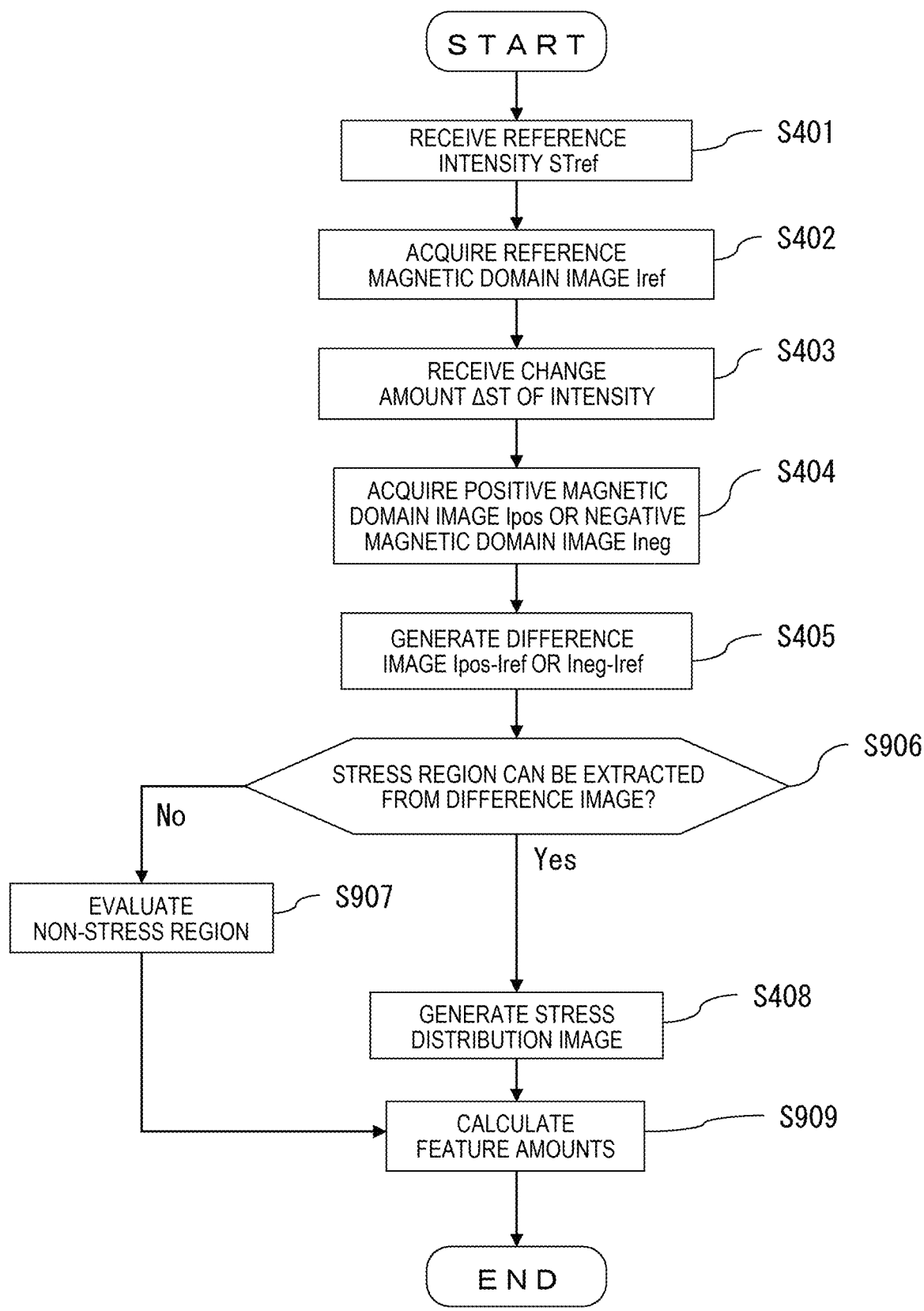

MAGNETIC DOMAIN IMAGE PROCESSING APPARATUS AND MAGNETIC DOMAIN IMAGE PROCESSING METHOD

CLAIM OF PRIORITY

The present application claims priority from Japanese Patent Application JP 2021-053004 filed on Mar. 26, 2021, the content of which is hereby incorporated by reference into this application.

BACKGROUND OF THE INVENTION

1. Field of the Invention

The present invention relates to a magnetic domain image processing apparatus and a magnetic domain image processing method for processing a magnetic domain image.

2. Description of the Related Art

When strain remains inside an electromagnetic steel sheet used in an electronic control component such as a motor, a solenoid, or a transformer, performance of the electronic control component is deteriorated due to complication of a magnetic domain of the electromagnetic steel sheet and an increase in iron loss, and therefore it is important to evaluate the strain inside the electromagnetic steel sheet.

JP-A-5699883 discloses a method for specifying strain of an electromagnetic steel sheet by using a magnetic permeability calculated using a plurality of magnetic domain images of the electromagnetic steel sheet and a relationship between a magnetic permeability and strain of a reference steel material whose strain is measured in advance, in order to easily and precisely specify the strain of the electromagnetic steel sheet. The magnetic permeability of the electromagnetic steel sheet and the magnetic permeability of the reference steel material are each calculated based on a change amount of a contrast which is digitized for each of magnetic domain images by binarizing the magnetic domain images acquired respectively under a plurality of magnetic fields, and a change amount of the magnetic field when the magnetic domain images are acquired.

However, in JP-A-5699883, since the magnetic permeability is calculated by using the change amount of the contrast which is digitized for each of the magnetic domain images, only the strain in an entire area of the magnetic domain image is specified, and a stress distribution is not evaluated. In order to improve the performance of the electronic control component, it is important to evaluate the electromagnetic steel sheet used in the electronic control component in more detail, and particularly to evaluate the stress distribution.

SUMMARY OF THE INVENTION

Therefore, an object of the invention is to provide a magnetic domain image processing apparatus and a magnetic domain image processing method by which a sample containing a magnetic material, such as an electromagnetic steel sheet, can be evaluated in more detail.

In order to achieve the above object, the invention provides a magnetic domain image processing apparatus that processes a magnetic domain image, and the magnetic domain image processing apparatus includes: an image acquisition unit configured to acquire a reference magnetic domain image and a positive magnetic domain image or acquire the reference magnetic domain image and a negative magnetic domain image, the reference magnetic domain image being a magnetic domain image that is obtained when a stimulus of a reference intensity that is an intensity serving as a reference is applied to a sample, the positive magnetic domain image being a magnetic domain image that is obtained when the stimulus of an intensity higher than the reference intensity is applied to the sample, and the negative magnetic domain image being a magnetic domain image that is obtained when the stimulus of an intensity lower than the reference intensity is applied to the sample; and an image generation unit configured to generate, based on the reference magnetic domain image and the positive magnetic domain image or based on the reference magnetic domain image and the negative magnetic domain image, a stress distribution image indicating a distribution of a stress region that is a region where stress is generated.

In addition, the invention provides a magnetic domain image processing method for processing a magnetic domain image, and the magnetic domain image processing method includes: an image acquisition step of acquiring a reference magnetic domain image and a positive magnetic domain image or acquiring the reference magnetic domain image and a negative magnetic domain image, the reference magnetic domain image being a magnetic domain image that is obtained when a stimulus of a reference intensity that is an intensity serving as a reference is applied to a sample, the positive magnetic domain image being a magnetic domain image that is obtained when the stimulus of an intensity higher than the reference intensity is applied to the sample, and the negative magnetic domain image being a magnetic domain image that is obtained when the stimulus of an intensity lower than the reference intensity is applied to the sample; and an image generation step of generating, based on the reference magnetic domain image and the positive magnetic domain image or based on the reference magnetic domain image and the negative magnetic domain image, a stress distribution image indicating a distribution of a stress region that is a region where stress is generated.

According to the invention, the magnetic domain image processing apparatus and the magnetic domain image processing method can be provided by which the sample containing the magnetic material, such as the electromagnetic steel sheet, can be evaluated in more detail.

BRIEF DESCRIPTION OF THE DRAWINGS

FIG. 9 is a diagram showing an example of a processing flow of a second embodiment.

DESCRIPTION OF THE PREFERRED EMBODIMENTS

Hereinafter, embodiments of a magnetic domain image processing apparatus and a magnetic domain image processing method according to the invention will be described with reference to accompanying drawings. The invention is not construed as being limited to the description of the embodiments to be described below.

First Embodiment

Figure 1:
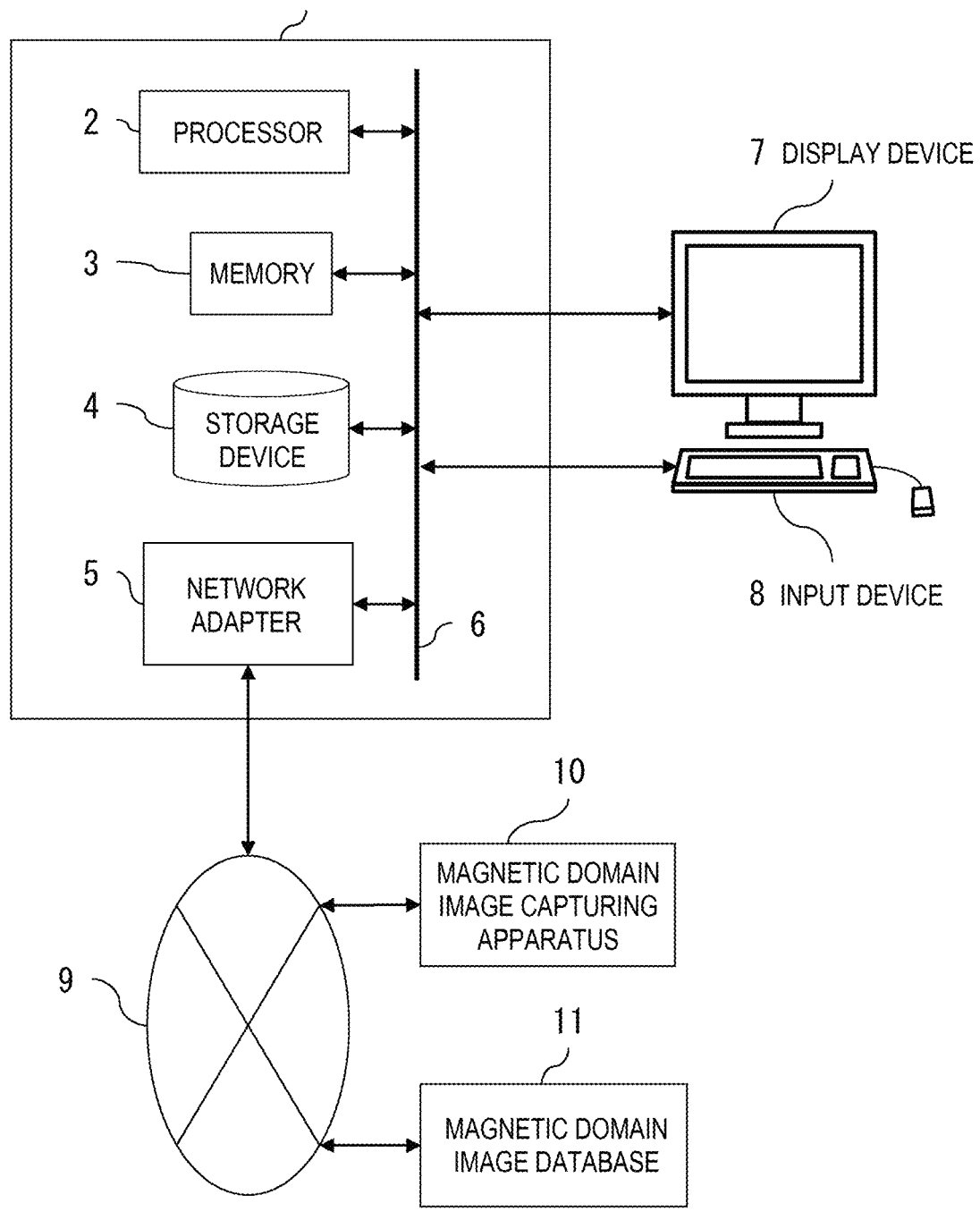
FIG. 1 is a diagram showing an example of a configuration of a magnetic domain image processing apparatus.

FIG. 1 is a diagram showing a hardware configuration of a magnetic domain image processing apparatus 1. The magnetic domain image processing apparatus 1 has a configuration in which a processor 2, a memory 3, a storage device 4, and a network adapter 5 are connected via a system bus 6 so as to be capable of transmitting and receiving a signal. In addition, the magnetic domain image processing apparatus 1 is connected to a magnetic domain image capturing apparatus 10 and a magnetic domain image database 11 via a network 9 so as to be capable of transmitting and receiving a signal, and is also connected to a display device 7 and an input device 8. Here, "capable of transmitting and receiving a signal" indicates a state of being capable of transmitting and receiving a signal to and from each other or from one to the other regardless of whether a connection is electrically or optically wired or wireless.

The processor 2 is a device that controls an operation of each component and executes a program stored in the storage device 4. The memory 3 stores the program to be executed by the processor 2 and a progress of operation processing. The storage device 4 is a device that stores the program to be executed by the processor 2 and data necessary for executing the program, and is specifically a hard disk drive (HHD), a solid state drive (SSD), or the like. The network adapter 5 is used for connecting the magnetic domain image processing apparatus 1 to the network 9 such as a local area network (LAN), a telephone line, or the Internet. Various data to be processed by the processor 2 may be transmitted to and received from the outside of the magnetic domain image processing apparatus 1 via the network 9 such as the local area network (LAN).

The display device 7 is a device that displays a processing result or the like of the magnetic domain image processing apparatus 1, and is specifically a liquid crystal display, a touch panel, or the like. The input device 8 is an operation device with which an operator gives an operation instruction to the magnetic domain image processing apparatus 1, and is specifically a keyboard, a mouse, a touch panel, or the like. A pointing device such as a trackpad or a trackball may be used instead of the mouse.

The magnetic domain image capturing apparatus 10 is an apparatus that captures a magnetic domain image, and is, for example, a Kerr microscope, a magnetic force microscope (MFM), a scanning electron microscope (SEM), or the like. The magnetic domain image database 11 is a database system that stores the magnetic domain image or the like captured by the magnetic domain image capturing apparatus 10.

Figure 2:
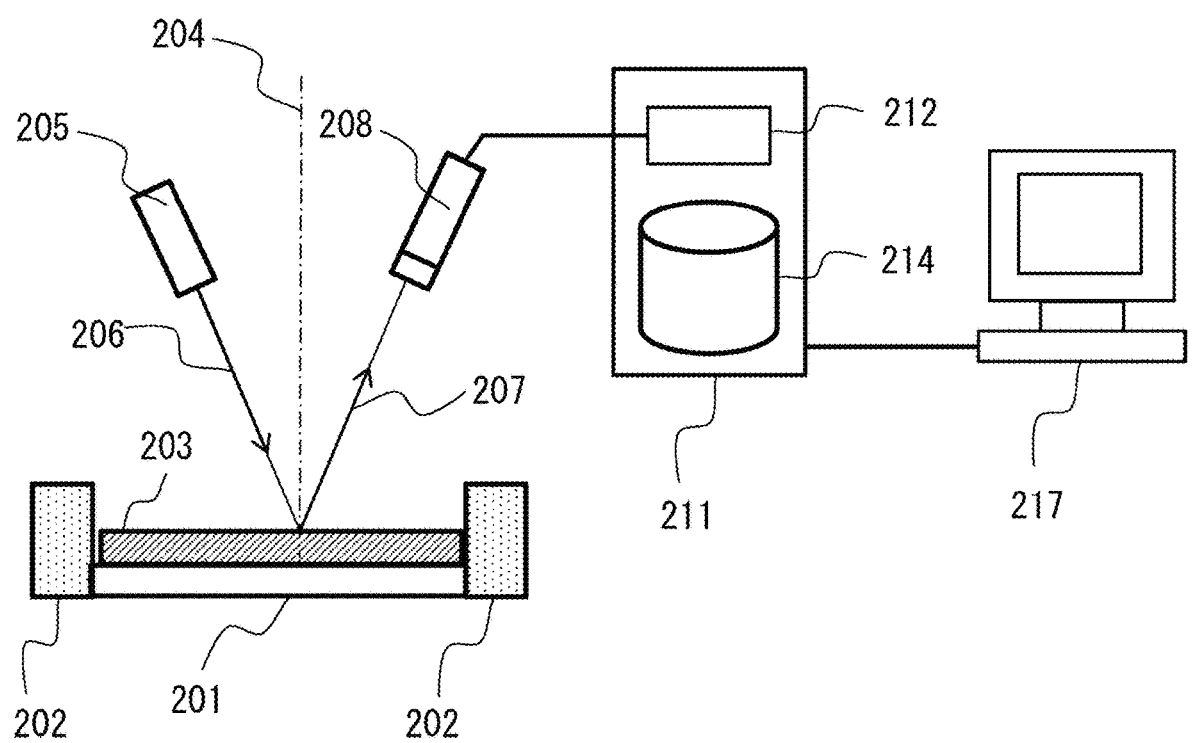
FIG. 2 is a diagram showing an example of a configuration of a magnetic domain image capturing apparatus.

A Kerr microscope, which is an example of the magnetic domain image capturing apparatus 10, will be described with reference to FIG. 2. The Kerr microscope illustrated in FIG. 2 includes a sample holder 201, electromagnetic coils 202, a light source 205, a photodetector 208, a magnetic domain image generation unit 211, and an image display unit 217.

The sample holder 201 is a stage that holds a sample 203 and is movable in three directions of X, Y, and Z axes. The sample 203 is a material containing a magnetic material, and is, for example, a soft magnetic material such as an electromagnetic steel sheet. A magnetic field of a predetermined intensity is applied to the sample 203 by the electromagnetic coils 202.

The light source 205 emits laser light 206 to a surface of the sample 203. The laser light 206 is visible light, ultraviolet light, or the like, and is emitted with an inclination of 45 degrees with respect to a sample normal 204 or is emitted in parallel with the sample normal 204. The sample normal 204 is a line orthogonal to the surface of the sample 203.

The photodetector 208 detects reflected light 207 of the laser light 206 which is emitted to the sample 203, and transmits a detection signal to the magnetic domain image generation unit 211. Light emitted to a magnetic material is reflected with a polarization plane rotated due to a Kerr effect. Therefore, the Kerr microscope detects a magnetization direction of the sample 203 by using the Kerr effect, and acquires the magnetic domain image. When the magnetization direction is parallel to the surface of the sample 203, the laser light 206 inclined at 45 degrees with respect to the sample normal 204 is emitted in order to use a longitudinal Kerr effect and a transverse Kerr effect. In addition, when the magnetization direction is parallel to the sample normal 204, the laser light 206 is emitted parallel to the sample normal 204 in order to use a polar Kerr effect.

The magnetic domain image generation unit 211 includes a signal processing unit 212 that generates the magnetic domain image by using the detection signal transmitted from the photodetector 208, and a storage unit 214 that stores the generated magnetic domain image. The generated magnetic domain image is displayed on the image display unit 217. The magnetic domain image generation unit 211 may be the magnetic domain image processing apparatus 1 shown in FIG. 1. In this case, the signal processing unit 212 corresponds to the processor 2, the storage unit 214 corresponds to the storage device 4, and the image display unit 217 corresponds to the display device 7.

Figure 3:
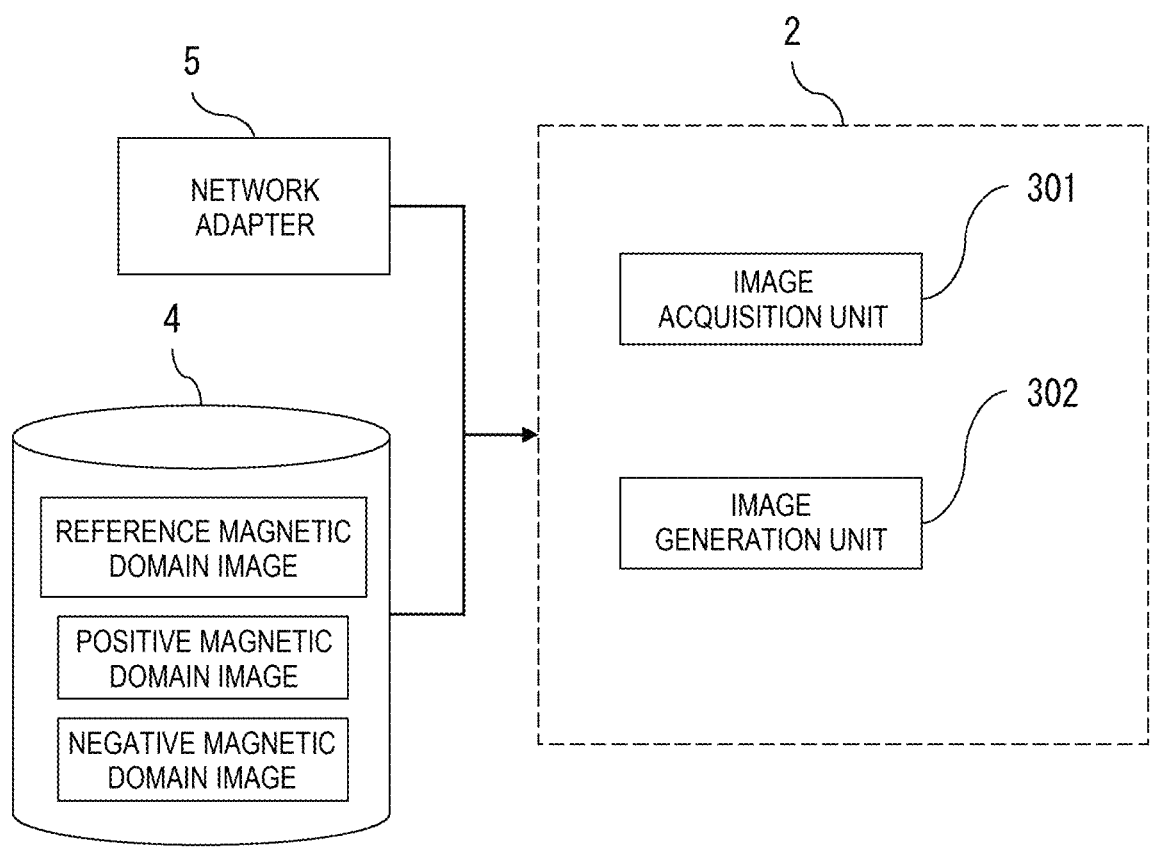
FIG. 3 is a diagram showing an example of a functional block of the magnetic domain image processing apparatus.

A functional block diagram of a first embodiment will be described with reference to FIG. 3. Each function shown in FIG. 3 may be implemented by dedicated hardware using an application specific integrated circuit (ASIC), a field-programmable gate array (FPGA), or the like, or may be implemented by software operating on the processor 2. In the following description, a case where each function of the first embodiment is implemented by the software will be described.

In the first embodiment, an image acquisition unit 301 and an image generation unit 302 are provided, and a predetermined magnetic domain image captured by the magnetic domain image capturing apparatus 10 is stored in the storage device 4. Hereinafter, each component will be described.

The image acquisition unit 301 acquires the predetermined magnetic domain image by receiving the predetermined magnetic domain image via the network adapter 5 or reading out the predetermined magnetic domain image from the storage device 4. The magnetic domain image acquired by the image acquisition unit 301 is, for example, a reference magnetic domain image, a positive magnetic domain image, or a negative magnetic domain image. The reference magnetic domain image is a magnetic domain image that is obtained when a stimulus of a reference intensity that is an intensity serving as a reference is applied to the sample 203. The stimulus applied to the sample 203 is, for example, the magnetic field applied by the electromagnetic coils 202 of the Kerr microscope, heating performed by a heater or the like, light emitted from a light source, or the like. The positive magnetic domain image is a magnetic domain image that is obtained when the stimulus of an intensity higher than the reference intensity is applied to the sample. The negative magnetic domain image is a magnetic domain image that is obtained when the stimulus of an intensity lower than the reference intensity is applied to the sample.

The positive magnetic domain image and the negative magnetic domain image are preferably captured in the same field of view as the reference magnetic domain image. In addition, it is preferable that a difference between the intensity of the stimulus when the positive magnetic domain image is obtained and the reference intensity is equal to a difference between the reference intensity and the intensity of the stimulus when the negative magnetic domain image is obtained, that is, the following equation is established.

$$STpos-STref=STref-STneg \quad \text{(Equation 1)}$$

Here, STref is the reference intensity, STpos is the intensity of the stimulus when the positive magnetic domain image is obtained, and STneg is the intensity of the stimulus when the negative magnetic domain image is obtained.

The image generation unit 302 generates, based on the reference magnetic domain image and the positive magnetic domain image or based on the reference magnetic domain image and the negative magnetic domain image, a stress distribution image indicating a distribution of a stress region that is a region where stress is generated in the sample 203. The stress distribution image is generated using, for example, a difference image obtained by subtracting the reference magnetic domain image from the positive magnetic domain image or the negative magnetic domain image. In the stress region, even when the intensity of the stimulus applied to the sample 203 changes, a pixel value of the magnetic domain image does not change, or changes less than a non-stress region that is a region other than the stress region even if the pixel value changes. That is, the stress is generated in a region where an absolute value of a pixel value of the difference image obtained by subtracting the reference magnetic domain image from the positive magnetic domain image or the negative magnetic domain image is less than a predetermined threshold value. The threshold value is set according to a magnitude of the generated stress.

Figure 4:
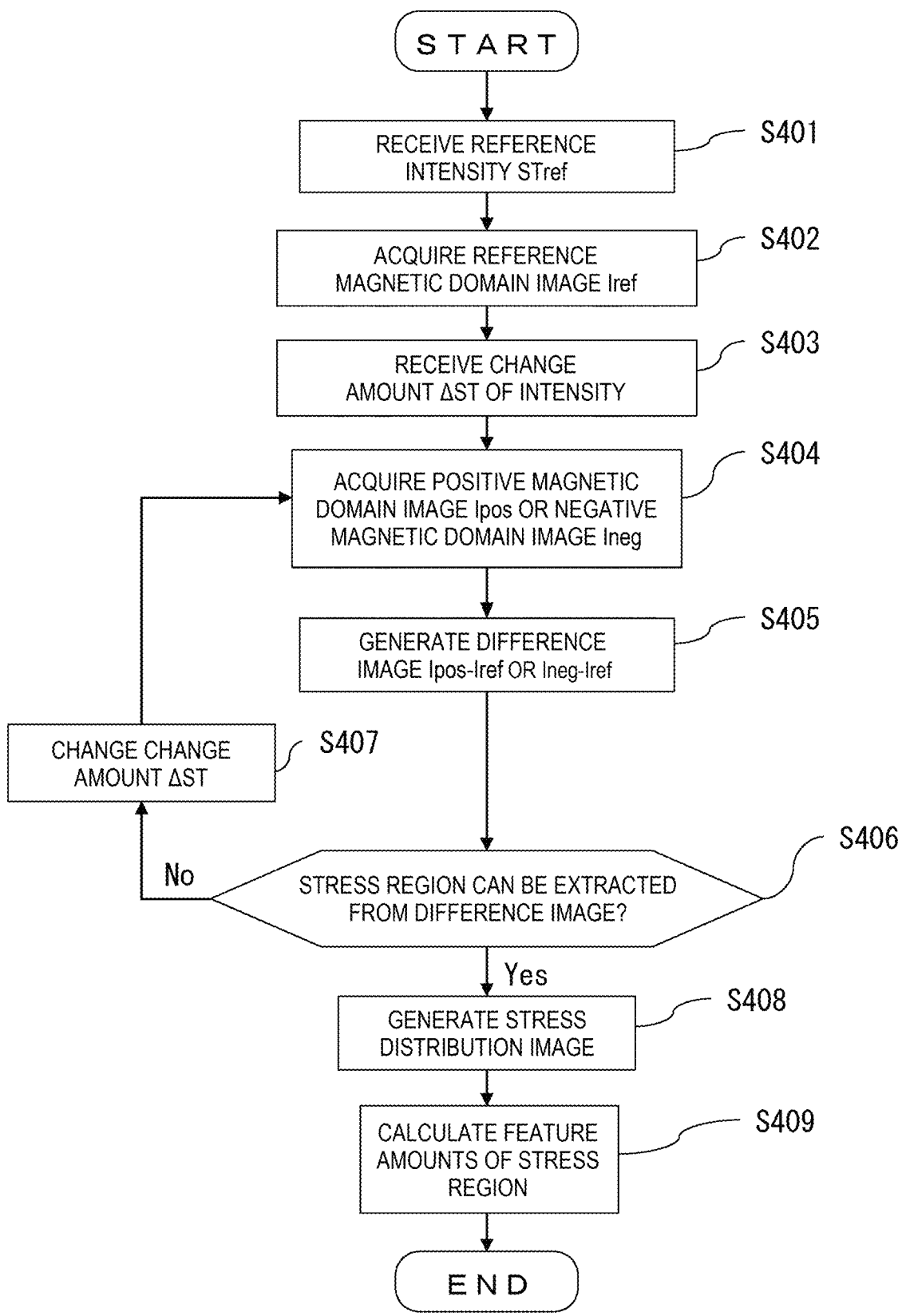
FIG. 4 is a diagram showing an example of a processing flow of a first embodiment.

An example of a processing flow of the first embodiment will be described step by step with reference to FIG. 4.

(S401)

The image acquisition unit 301 receives the reference intensity STref of the stimulus applied to the sample 203. The stimulus applied to the sample 203 is, for example, the magnetic field, the reference intensity STref is set based on a magnetization curve of the sample 203, and the reference intensity STref of the magnetic field applied to the sample 203 may be set, for example, based on a singular point of the magnetization curve. The magnetization curve of the sample 203 is acquired in advance by measurement using a vibrating sample magnetometer (VSM), an Epstein test, a single sheet test, or the like. In addition, the magnetization curve may be acquired based on a plurality of magnetic domain images that are acquired using the Kerr microscope.

(S402)

The image acquisition unit 301 acquires a reference magnetic domain image Iref which is a magnetic domain image when the stimulus of the reference intensity STref received in S401 is applied to the sample 203. The reference magnetic domain image Iref is newly captured by the magnetic domain image capturing apparatus 10 such as the Kerr microscope or stored in advance in the magnetic domain image database 11 or the storage device 4.

(S403)

The image acquisition unit 301 receives a change amount ΔST of the intensity of the stimulus applied to the sample 203. The change amount ΔST of the intensity is set by the operator via, for example, the input device 8.

(S404)

The image acquisition unit 301 acquires a positive magnetic domain image Ipos or a negative magnetic domain image Ineg, which are magnetic domain images when the stimulus of an intensity STref±ΔST obtained by adding or subtracting the change amount ΔST of the intensity received in S403 to or from the reference intensity STref is applied to the sample 203. The positive magnetic domain image Ipos or the negative magnetic domain image Ineg are newly captured by the magnetic domain image capturing apparatus 10 such as the Kerr microscope or stored in advance in the magnetic domain image database 11 or the storage device 4.

(S405)

The image generation unit 302 generates a difference image Ipos−Iref or Ineg−Iref by using the reference magnetic domain image Iref acquired in S402 and the positive magnetic domain image Ipos or the negative magnetic domain image Ineg acquired in S404. Ipos-Iref is referred to as a first difference image, and Ineg-Iref is referred to as a second difference image.

Figure 5:
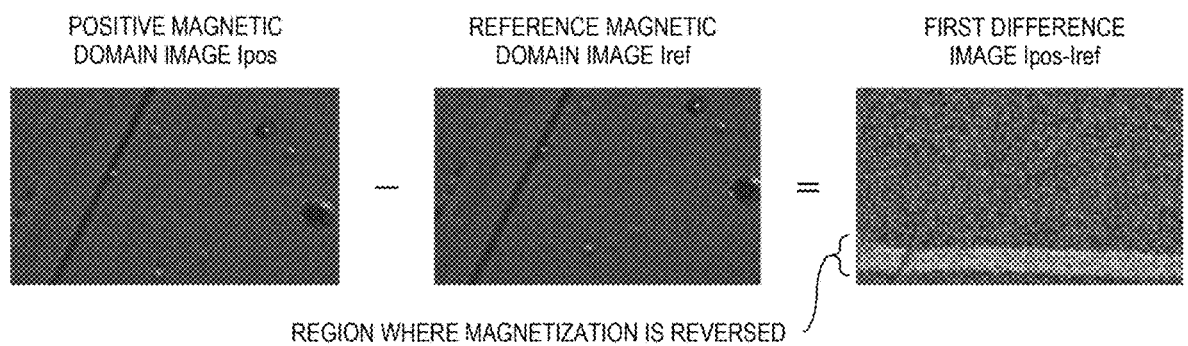
FIG. 5 is a diagram illustrating an example of a difference image.

An example of the difference image will be described with reference to FIG. 5. FIG. 5 illustrates the first difference image Ipos-Iref obtained by subtracting the reference magnetic domain image Iref from the positive magnetic domain image Ipos. Prior to difference processing, a field of view of the positive magnetic domain image Ipos and a field of view of the reference magnetic domain image Iref are aligned. In a region where magnetization is reversed by application of the magnetic field, a pixel value of the positive magnetic domain image Ipos is larger than a pixel value of the reference magnetic domain image Iref, and the region is displayed as a region that is changed to white in the first difference image. In addition, in a region where a magnetic domain is not reversed, a difference between the pixel values of the two magnetic domain images is small, and the region is displayed as a gray region in the first difference image. In the second difference image Ineg-Iref, a region where the magnetization is reversed is displayed as a region that is changed to black, and a region where the magnetic domain is not reversed is displayed as a gray region similarly to in the first difference image.

(S406)

The image generation unit 302 determines whether or not the stress region can be extracted from the difference image generated in S405. That is, it is determined that the stress region can be extracted and processing proceeds to S408 if there is a region where the absolute value of the pixel value is less than the predetermined threshold value in the difference image, and it is determined that the stress region cannot be extracted and processing is returned to S404 via S407 if there is not the region.

(S407)

The image acquisition unit 301 changes the change amount ΔST of the intensity received in S403. For example, the change amount ΔST is multiplied by a coefficient less than 1.

Changing of the change amount ΔST of the intensity performed in S407 is repeated until the stress region can be extracted from the difference image in S406. That is, in S407, the intensity of the stimulus when the positive magnetic domain image or the negative magnetic domain image is obtained is adjusted so as to enable the extraction of the stress region from the difference image in S406.

(S408)

The image generation unit 302 generates the stress distribution image indicating the distribution of the stress region that is extracted from the difference image generated in S405. The generated stress distribution image is displayed on the display device 7 or stored in the storage device 4. The stress region may be superimposed on, for example, a SEM image representing a surface shape of the sample 203 or a crystal orientation image representing a crystal orientation.

Figure 6:
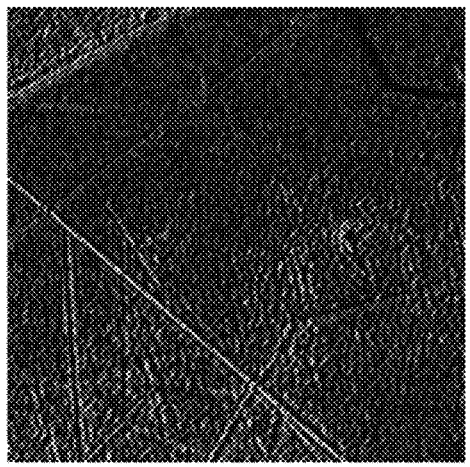
FIG. 6 is a diagram showing an example of difference images and a stress region.
Figure 6:
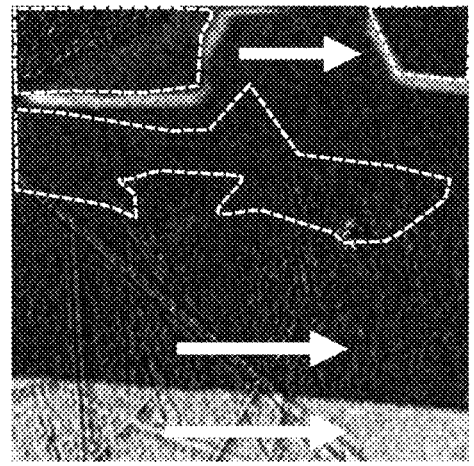
Figure 6:
Figure 6:
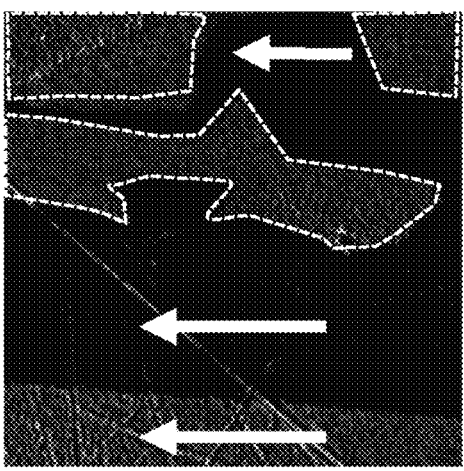
Figure 6:
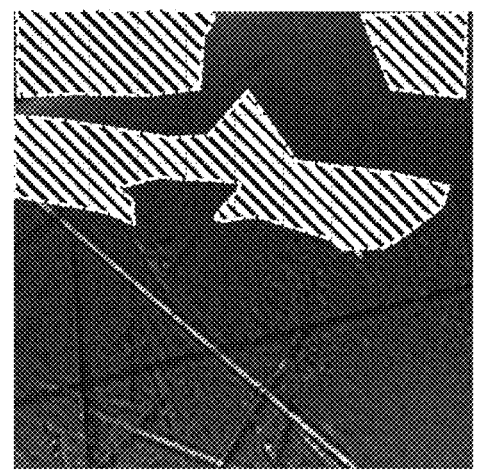

An example of the difference images and the stress region will be described with reference to FIG. 6. FIG. 6 illustrates the reference magnetic domain image Iref, the first difference image Ipos-Iref, the second difference image Ineg-Iref, and an image in which the stress region is superimposed on the SEM image that is a shape image. A region where an absolute value of a difference between the pixel value of the positive magnetic domain image Ipos and the pixel value of the reference magnetic domain image Iref or between the pixel value of the negative magnetic domain image Ineg and the pixel value of the reference magnetic domain image Iref is less than the threshold value is shown as a region surrounded by a dotted line in the first difference image or the second difference image, and is shown as a shaded portion in the SEM image. That is, the region indicated by the shaded portion in the SEM image is the stress region, and the SEM image on which the stress region is superimposed is displayed on the display device 7, so that the operator can easily grasp the distribution of the stress region in a field of view of the SEM image.

Further, in the first difference image or the second difference image, a direction of the magnetic domain is specified based on a magnetic field direction and the pixel value. The specified direction of the magnetic domain may be indicated by an arrow in the first difference image or the second difference image as illustrated in FIG. 6.

(S409)

The image generation unit 302 calculates feature amounts related to the stress region extracted in S408. The calculated feature amounts are, for example, a position, an area, a shape, and a ratio, and are displayed on the display device 7 or stored in the storage device 4 together with the stress distribution image. The position may be expressed as a coordinate of a center of gravity of the stress region, the shape may be expressed as a ratio of a longitudinal length to a transverse length of the stress region, and the ratio may be expressed as a value obtained by dividing the area of the stress region by an area of the field of view. By displaying the feature amounts related to the stress region, the operator can easily compare the stress region for each field of view or each sample.

Figure 7:
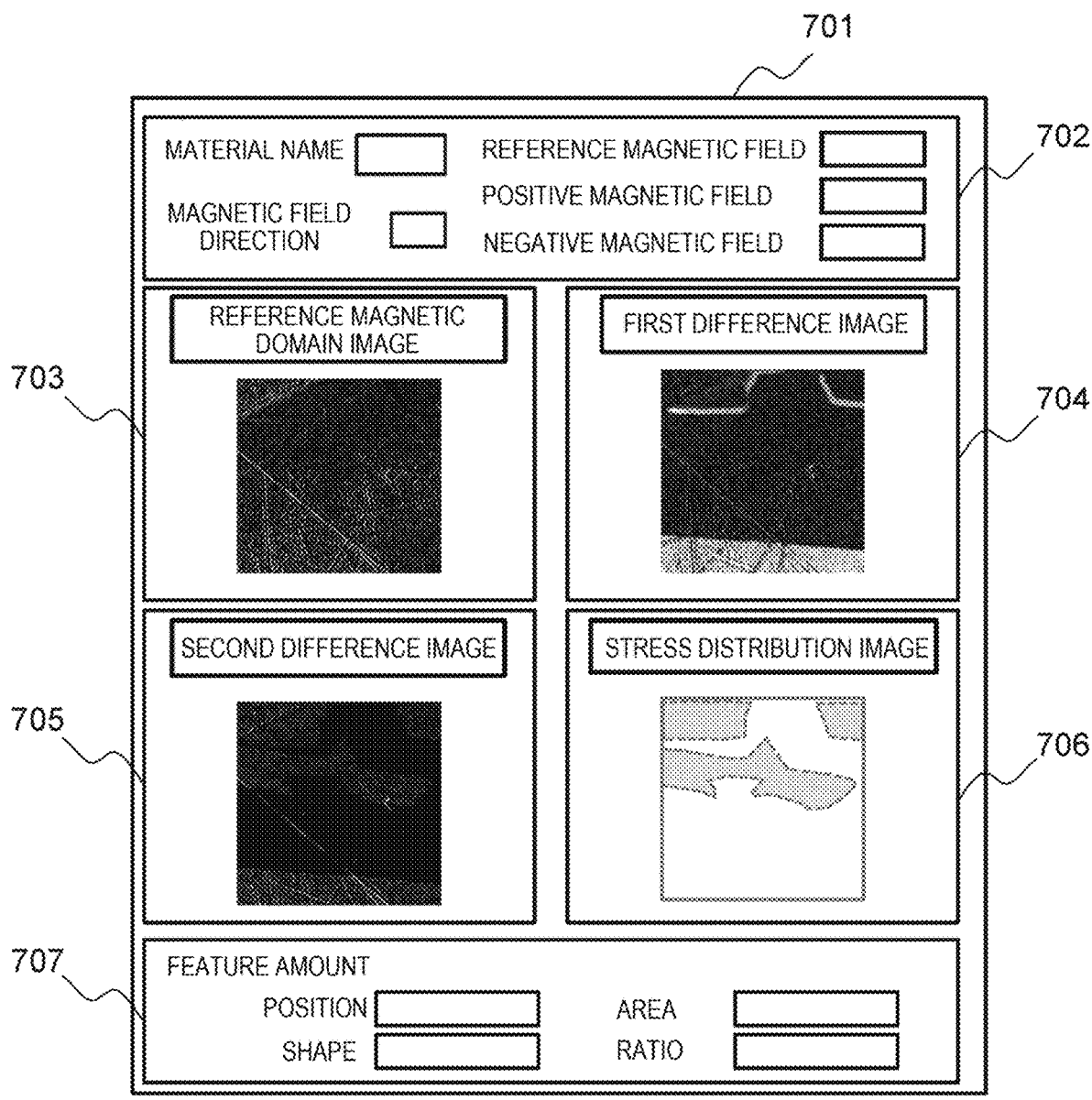
FIG. 7 is a diagram showing an example of an input and output screen of the first embodiment.

An example of an input and output screen will be described with reference to FIG. 7. An input and output screen 701 illustrated in FIG. 7 includes a condition display part 702, a reference magnetic domain image display part 703, a first difference image display part 704, a second difference image display part 705, a stress distribution image display part 706, and a feature amount display part 707.

The condition display part 702 displays, for example, a material name of the sample 203, a reference magnetic field, a magnetic field direction, a positive magnetic field, and a negative magnetic field, as conditions related to generation of the stress distribution image. The reference magnetic field is the stimulus of the reference intensity applied to the sample 203, the magnetic field direction is a direction of the reference magnetic field, the positive magnetic field is the stimulus of the intensity higher than the reference intensity, and the negative magnetic field is the stimulus of the intensity lower than the reference intensity.

The reference magnetic domain image display part 703 displays the reference magnetic domain image, the first difference image display part 704 displays the first difference image, the second difference image display part 705 displays the second difference image, and the stress distribution image display part 706 displays the stress distribution image. In each of the first difference image and the second difference image, the direction of the magnetic domain may be indicated by the arrow as illustrated in FIG. 6.

The operator can evaluate a state of the stress region while comparing the images by displaying the reference magnetic domain image, the first difference image, the second difference image, and the stress distribution image on the same screen. In particular, since the direction of the magnetic domain around the stress region can be grasped by comparing the first difference image and the second difference image with the stress distribution image, the sample 203 can be evaluated in more detail. When the first difference image and the second difference image are compared with the stress distribution image, it is preferable that Equation 1 is satisfied in order to more easily grasp the direction of the magnetic domain around the stress region.

The feature amount display part 707 displays, for example, the position, the area, the shape, and the ratio, as the feature amounts related to the stress region. If a plurality of stress regions are extracted from the first difference image or the second difference image, a plurality of feature amount display parts 707 are displayed according to the number of extracted stress regions. That is, the feature amounts related to the stress region are calculated and displayed for each of the extracted stress regions.

Another example of the input and output screen will be described with reference to FIG. 8. Similarly to the screen in FIG. 7, the input and output screen 801 illustrated in FIG. 8 includes the condition display part 702, the reference magnetic domain image display part 703, the stress distribution image display part 706, and the feature amount display part 707, and further includes a shape image display part 802 and a crystal orientation image display part 803. Description of the same configuration as the screen in FIG. 7 is omitted.

The shape image display part 802 displays the shape image representing the shape of the sample 203, for example, the SEM image, and the crystal orientation image display part 803 displays the crystal orientation image representing the crystal orientation of the sample 203. The shape image and the crystal orientation image are analysis images captured by another apparatus, and are acquired via the network adapter 5. The shape image display part 802 and the crystal orientation image display part 803 may display the shape image and the crystal orientation image on which the stress region is superimposed, respectively. In the shape image illustrated in FIG. 8, the stress region is shown as a region surrounded by a dotted line.

Figure 8:
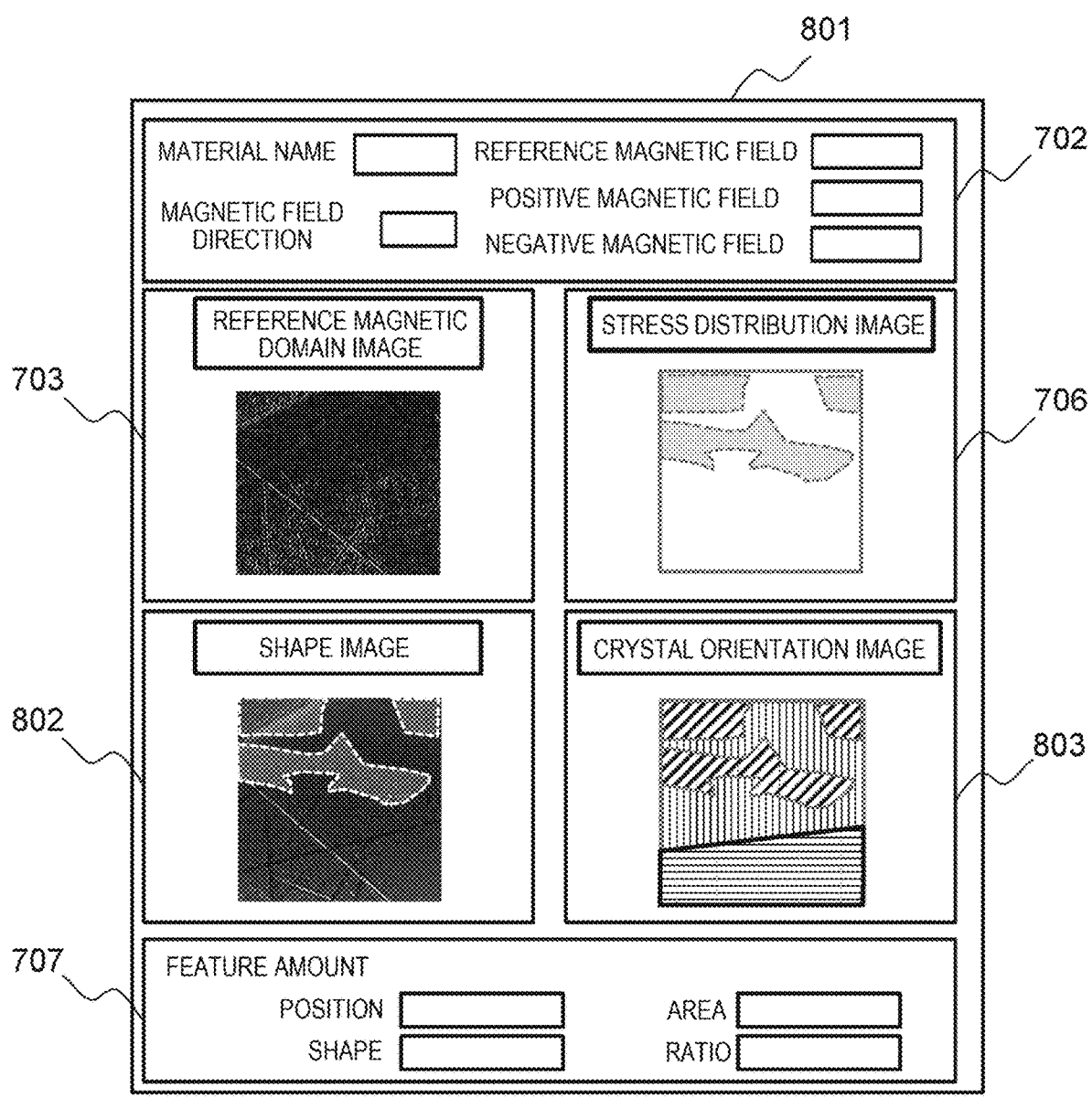
FIG. 8 is a diagram showing another example of the input and output screen of the first embodiment.

As in the input and output screen 801 illustrated in FIG. 8, the analysis images captured by the another apparatus and the stress distribution image are displayed on the same screen, so that the operator can evaluate the state of the stress region while comparing the stress distribution image with the analysis images, and can easily estimate or clarify a cause of the stress.

According to the processing flow described above, the stress distribution image indicating the distribution of the stress region in the field of view of the magnetic domain image of the sample 203 is generated and displayed. The operator can evaluate the sample containing the magnetic material in more detail based on the displayed stress distribution image. The stress distribution image may be generated in a plurality of fields of view. More detailed evaluation can be performed in various regions of the sample 203 by generating the stress distribution image in a plurality of fields of view.

Second Embodiment

In the first embodiment, a case is described where if the stress region cannot be extracted from the difference image, the intensity of the stimulus when the positive magnetic domain image or the negative magnetic domain image is obtained is adjusted so as to enable the extraction of the stress region. In a second embodiment, a case will be described where the region other than the stress region, that is, the non-stress region where no stress is generated is evaluated if the stress region cannot be extracted. Since the hardware configuration and the functional block diagram of the magnetic domain image processing apparatus 1 are the same as those of the first embodiment, the description thereof is omitted.

An example of a processing flow of the second embodiment will be described step by step with reference to FIG. 9. The same processing as that in the first embodiment is denoted by the same step number, and the description thereof is simplified.

(S401) to (S405)

As in the first embodiment, the reference magnetic domain image Iref and the positive magnetic domain image Ipos or the reference magnetic domain image Iref and the negative magnetic domain image Ineg are acquired, and the difference image between the reference magnetic domain image Iref and the positive magnetic domain image Ipos or between the reference magnetic domain image Iref and the negative magnetic domain image Ineg is generated.

(S906)

The image generation unit 302 determines whether or not the stress region can be extracted from the difference image generated in S405. That is, it is determined that the stress region can be extracted and processing proceeds to S408 if there is the region where the absolute value of the pixel value is less than the predetermined threshold value in the difference image, and it is determined that the stress region cannot be extracted and processing proceeds to S907 if there is not the region.

(S907)

The image generation unit 302 evaluates the non-stress region based on the pixel value of the magnetic domain image. For example, by comparing the pixel value of the reference magnetic domain image with the pixel value of the positive magnetic domain image or the negative magnetic domain image, a change amount of an area of each magnetic domain is calculated or a movement direction of a domain wall surrounding the magnetic domain is obtained in the non-stress region.

(S408)

As in the first embodiment, the stress distribution image indicating the distribution of the stress region is generated, and displayed on the display device 7 or stored in the storage device 4. The stress region may be superimposed on the SEM image or the like.

(S909)

The image generation unit 302 calculates the feature amounts related to the stress region extracted in S408, or uses a result of evaluating the non-stress region in S907 as the feature amounts. The feature amounts related to the stress region are calculated in the same manner as in the first embodiment.

According to the processing flow described above, the stress distribution image generated in the same manner as in the first embodiment is displayed when the stress region is extracted, and an evaluation result of the non-stress region is displayed when the stress region is not extracted. The operator can evaluate the sample containing the magnetic material in more detail based on the stress distribution image or the evaluation result of the non-stress region that is displayed.

The two embodiments of the magnetic domain image processing apparatus and the magnetic domain image processing method of the invention have been described above. The magnetic domain image processing apparatus and the magnetic domain image processing method of the invention are not limited to the above embodiments, and may be embodied by modifying components without departing from the scope of the invention. Further, a plurality of components disclosed in the embodiments may be combined as appropriate. Further, some components may be deleted from all the components shown in the above embodiments.

What is claimed is:

1. A magnetic domain image processing apparatus that processes a magnetic domain image, the magnetic domain image processing apparatus comprising:
an image acquisition unit configured to acquire a reference magnetic domain image and a positive magnetic domain image or acquire the reference magnetic domain image and a negative magnetic domain image, the reference magnetic domain image being a magnetic domain image that is obtained when a stimulus of a reference intensity that is an intensity serving as a reference is applied to a sample, the positive magnetic domain image being a magnetic domain image that is obtained when the stimulus of an intensity higher than the reference intensity is applied to the sample, and the negative magnetic domain image being a magnetic domain image that is obtained when the stimulus of an intensity lower than the reference intensity is applied to the sample; and
an image generation unit configured to generate, based on the reference magnetic domain image and the positive magnetic domain image or based on the reference magnetic domain image and the negative magnetic domain image, a stress distribution image indicating a distribution of a stress region that is a region where stress is generated; and
wherein
a first difference image obtained by subtracting the reference magnetic domain image from the positive magnetic domain image and a second difference image obtained by subtracting the reference magnetic domain image from the negative magnetic domain image are displayed on a screen.

2. The magnetic domain image processing apparatus according to claim 1, wherein
the stimulus is a magnetic field applied to the sample, and
the reference intensity is set based on a magnetization curve that is acquired in advance by using the sample.

3. The magnetic domain image processing apparatus according to claim 2, wherein
the reference intensity is set based on a singular point of the magnetization curve.

4. The magnetic domain image processing apparatus according to claim 1, wherein
the stimulus is applied to the sample by application of a magnetic field, heating, or light emission.

5. The magnetic domain image processing apparatus according to claim 1, wherein
an arrow indicating a direction of a magnetic domain is displayed in each of the first difference image and the second difference image.

6. The magnetic domain image processing apparatus according to claim 1, wherein
when the reference intensity is set to STref, the intensity of the stimulus when the positive magnetic domain image is obtained is set to STpos, and the intensity of the stimulus when the negative magnetic domain image is obtained is set to STneg, $$STpos-STref=STref-STneg.$$

7. The magnetic domain image processing apparatus according to claim 1, wherein
the image generation unit is configured to evaluate, when the stress region is not extracted, a non-stress region where no stress is generated.

8. The magnetic domain image processing apparatus according to claim 7, wherein
the image generation unit is configured to calculate a change amount of an area of a magnetic domain or obtain a movement direction of a domain wall surrounding the magnetic domain in the non-stress region.

* * * * *